United States Patent
Tsuruma et al.

(10) Patent No.: US 9,178,076 B2
(45) Date of Patent: Nov. 3, 2015

(54) THIN-FILM TRANSISTOR

(75) Inventors: Yuki Tsuruma, Sodegaura (JP);
Kazuaki Ebata, Sodegaura (JP);
Shigekazu Tomai, Sodegaura (JP);
Shigeo Matsuzaki, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 14/238,019

(22) PCT Filed: Aug. 8, 2012

(86) PCT No.: PCT/JP2012/005028
§ 371 (c)(1),
(2), (4) Date: Mar. 10, 2014

(87) PCT Pub. No.: WO2013/021632
PCT Pub. Date: Feb. 14, 2013

(65) Prior Publication Data
US 2014/0197408 A1    Jul. 17, 2014

(30) Foreign Application Priority Data
Aug. 11, 2011    (JP) .................. 2011-176315

(51) Int. Cl.
*H01L 29/12*    (2006.01)
*H01L 29/786*    (2006.01)
(Continued)

(52) U.S. Cl.
CPC ...... *H01L 29/78693* (2013.01); *C23C 14/0057* (2013.01); *C23C 14/086* (2013.01); *C23C 14/34* (2013.01); *C23C 14/3414* (2013.01); *H01L 21/02381* (2013.01); *H01L 21/02488* (2013.01); *H01L 21/02565* (2013.01); *H01L 21/02581* (2013.01); *H01L 21/02631* (2013.01);
(Continued)

(58) Field of Classification Search
CPC .................................................. H01L 29/78693
USPC ............................................................ 257/43
See application file for complete search history.

(56) References Cited

U.S. PATENT DOCUMENTS 8,384,077 B2 * 2/2013 Yano et al. ...................... 257/43
8,692,243 B2 * 4/2014 Kamata et al. ................... 257/43
(Continued)

FOREIGN PATENT DOCUMENTS

JP    2007-250987 A    9/2007
JP    2009-141342 A    6/2009
(Continued)

OTHER PUBLICATIONS

International Preliminary Report and International Search Report dated Feb. 20, 2014 received in International Application No. PCT/JP2012/005028.

*Primary Examiner* — David S Blum
(74) *Attorney, Agent, or Firm* — Foley & Lardner LLP

(57) ABSTRACT

A thin film transistor (1) includes a source electrode (50), a drain electrode (60), a gate electrode (20), a gate insulating film (30), and a channel layer (40) that is formed of an oxide semiconductor, the channel layer (40) having an average carrier concentration of $1 \times 10^{16}/cm^3$ to $5 \times 10^{19}/cm^3$, and including a high carrier concentration region (42) that is situated on the side of the gate insulating film (30) and has a carrier concentration higher than the average carrier concentration, and the channel layer (40) having a substantially homogenous composition.

10 Claims, 3 Drawing Sheets

(51) Int. Cl.
*C23C 14/00* (2006.01)
*C23C 14/08* (2006.01)
*C23C 14/34* (2006.01)
*H01L 21/02* (2006.01)

(52) U.S. Cl.
CPC ...... *H01L21/02667* (2013.01); *H01L 29/7869* (2013.01); *H01L 29/78696* (2013.01)

(56) References Cited

U.S. PATENT DOCUMENTS

| | | |
|---|---|---|
| 2008/0237598 A1 | 10/2008 | Nakayama |
| 2009/0127551 A1 | 5/2009 | Imai |
| 2010/0006834 A1 | 1/2010 | Kim et al. |
| 2010/0065835 A1 | 3/2010 | Inoue et al. |
| 2010/0176383 A1 | 7/2010 | Park et al. |
| 2011/0050733 A1 | 3/2011 | Yano et al. |
| 2011/0168994 A1* | 7/2011 | Kawashima et al. ........... 257/43 |
| 2011/0180763 A1 | 7/2011 | Utsuno et al. |
| 2011/0315936 A1* | 12/2011 | Inoue et al. .................... 252/512 |

FOREIGN PATENT DOCUMENTS

| | | |
|---|---|---|
| JP | 2009-212497 A | 9/2009 |
| JP | 2010-021555 A | 1/2010 |
| JP | 2010-161327 A | 7/2010 |
| JP | 2010-165922 A | 7/2010 |
| JP | 2010-258196 A | 11/2010 |
| WO | WO-2008/096768 A1 | 8/2008 |
| WO | WO-2010/032422 A1 | 3/2010 |
| WO | WO-2010/032431 A1 | 3/2010 |
| WO | WO 2013179922 A1 * | 12/2013 |

* cited by examiner

THIN-FILM TRANSISTOR

CROSS-REFERENCE TO RELATED APPLICATIONS

This application is the National Phase of PCT/JP2012/005028, filed Aug. 8, 2012, which claims priority to Japanese Application No. 2011-176315, filed Aug. 11, 2011, the disclosures of which are hereby incorporated by reference in their entirety.

TECHNICAL FIELD

The invention relates to a thin film transistor (TFT) that includes an oxide semiconductor layer as a channel layer.

BACKGROUND ART

A field effect transistor (FET) has been widely used as a unit electronic device (element) for a semiconductor memory integrated circuit, a high-frequency signal amplifier device, a liquid crystal driving device, and the like. A thin film transistor (TFT) is classified as the field effect transistor. In recent years, the TFT has been widely used as a switching device for various displays that have been rapidly developed. Examples of such displays include a liquid crystal display (LCD), an organic electroluminescence (EL) display, and the like.

The LCD has been the mainstream in the fields of medium and small-sized display panels and large-sized image display panels used for TV applications. Since the organic EL display can achieve high resolution as compared with the LCD, future development thereof has been desired.

The frame rate of the LCD has been increased along with an improvement in moving picture resolution and the spread of three-dimensional displays. It is effective to drive the LCD at a high frame rate for improving the moving picture resolution, and a further increase in high frame has been desired. A large screen, a high resolution, and high frame rate drive have been the keys to the development of displays, and the TFT has been required to achieve performance necessary for implementing these requirements. For example, the TFT has been required to achieve high mobility along with an increase in pixel capacitance for implementing a large screen, an increase in the number of scan lines for implementing a high resolution, and an increase in frame rate.

The mobility of an a-Si:H (hydrogenated amorphous silicon) TFT used for the LCD is about 2 $cm^2$/Vs or less. However, it has become difficult to deal with the above requirements (i.e., large screen, high resolution, and high frame rate drive) for displays when the mobility of the TFT is about 2 $cm^2$/Vs or less.

Since the organic EL device is a current-driven device, and an increase in current value of a drive TFT is required to improve the luminance of the screen, a high-mobility TFT is indispensable for the organic EL display. The TFT used to drive the organic EL display is also required to exhibit current stress reliability in addition to high mobility. Low-temperature poly-Si (LTPS) has been considered to be a candidate for a TFT material that satisfies both high mobility and current stress reliability. When using LTPS, however, the screen size that can be implemented may be limited due to the beam length used during laser crystallization, and the TFT characteristics may show in-plane non-uniformity due to an inter-shot variation of laser light.

A TFT that utilizes an oxide semiconductor instead of a-Si:HTFT or LTPS has attracted attention. For example, a TFT in which an oxide semiconductor such as zinc oxide (ZnO) or indium gallium zinc oxide (IGZO) is used for an active layer (semiconductor layer) exhibits high mobility, and development thereof has progressed.

The oxide semiconductor includes a highly ionic bond, and is characterized in that the difference in electron mobility is small between a crystalline state and an amorphous state. Specifically, a relatively high electron mobility can be implemented even in an amorphous state. Moreover, since the oxide semiconductor is rarely affected by the grain boundary barrier even when the oxide semiconductor is crystallized, it is possible to produce a TFT that is suitable for an increase in area that requires in-plane uniformity. Since a gap state derived from oxygen deficiencies is present in the vicinity of the valence band, holes do not easily become a free carrier as compared with electrons. Therefore, the off current during the operation of the TFT can be reduced to about 10 to 15 A. Since the oxide semiconductor is a wide-bandgap semiconductor as compared with a silicon-based material (TFT), the oxide semiconductor exhibits excellent stability to light in the visible region. Since an amorphous oxide semiconductor film can be formed at room temperature by utilizing a sputtering method or the like, studies have been conducted to form an oxide semiconductor film transistor on a resin substrate (e.g., PET).

As a TFT technique that utilizes the oxide semiconductor, Patent Document 1 discloses a semiconductor device that utilizes a crystalline oxide having an electron carrier concentration of less than $2\times10^{17}/cm^3$ as an n-type semiconductor, and exhibits excellent stability, uniformity, reproducibility, heat resistance, durability, and the like.

Patent Document 2 discloses a TFT in which indium tin oxide (ITO) or the like is used for the channel layer as an oxide conductive material having a high carrier concentration. In Patent Document 2, a reduction in leakage current and an improvement in subthreshold factor are achieved by forming the channel layer consisting of an very thin film (6 to 10 nm) to have a uniform thickness, and planarizing the surface of the gate insulating film to improve the interfacial characteristics.

In Patent Document 3, an oxide semiconductor film having a carrier concentration of about $1\times10^{18}$ $cm^{-3}$ is formed by sputtering an oxide sintered body in which gallium is solid-dissolved in indium oxide.

In Patent Document 4, the on-off ratio of a bottom-gate TFT is improved by increasing the oxygen density in the surface layer of the oxide semiconductor as compared with the side of the gate insulating film by applying oxygen-containing plasma.

Patent Document 5 discloses an oxide TFT that includes two active layers formed of indium zinc oxide (or ITO) and GIZO, and states that high mobility and a good threshold voltage are obtained. Specifically, the TFT disclosed in Patent Document 5 has a configuration in which a GIZO layer having a thickness of 60 nm and a low carrier concentration is formed on an indium zinc oxide (or ITO) layer having a thickness of 5 nm and a high carrier concentration.

However, the techniques disclosed in Patent Documents 1 to 5 have the following problems.

According to the technique disclosed in Patent Document 1, since the electron carrier concentration is less than $2\times10^{17}$ $cm^{-3}$, it is necessary to improve the mobility.

According to the technique disclosed in Patent Document 2, since the thickness of the channel layer is 10 nm or less, the channel layer may be formed in the shape of an island, and an area in which the semiconductor layer is not formed may occur in the channel layer.

According to the technique disclosed in Patent Document 3, since regions that differ in carrier concentration are not provided in the oxide semiconductor layer, an improvement in subthreshold factor is required.

According to the technique disclosed in Patent Document 4, a high oxygen density region is formed in the semiconductor layer by oxygen plasma treatment to improve the ON/OFF ratio. However, high mobility is not obtained.

According to the technique disclosed in Patent Document 5, since the channel layer having a two-layer structure is necessary, a decrease in productivity and an increase in production cost occur as compared with the case of forming the channel layer using a single material.

RELATED-ART DOCUMENT

Patent Document

Patent Document 1: WO2008/096768
Patent Document 2: JP-A-2007-250987
Patent Document 3: WO2010/032422
Patent Document 4: JP-A-2010-258196
Patent Document 5: JP-A-2010-21555

SUMMARY OF THE INVENTION

In view of the above situation, an object of the invention is to provide a thin film transistor that exhibits high mobility and a large on-off ratio. Another object of the invention is to provide a thin film transistor that can be efficiently produced.

One aspect of the invention provides the following thin film transistor.

1. A thin film transistor including a source electrode, a drain electrode, a gate electrode, a gate insulating film, and a channel layer that is formed of an oxide semiconductor,
   the channel layer having an average carrier concentration of $1\times10^{16}/cm^3$ to $5\times10^{19}/cm^3$, and including a high carrier concentration region that is situated on a side of the gate insulating film and has a carrier concentration higher than the average carrier concentration, and
   the channel layer having a substantially homogeneous composition.
2. The thin film transistor according to 1, wherein the channel layer has a thickness of 10 nm or more, and the high carrier concentration region has an average carrier concentration of $1\times10^{18}/cm^3$ to $5\times10^{21}/cm^3$.
3. The thin film transistor according to 1 or 2, wherein the high carrier concentration region is a region of the channel layer up to a depth of about 5 nm from an interface with the gate insulating film.
4. The thin film transistor according to any one of 1 to 3, wherein the oxide semiconductor has a crystalline structure.
5. The thin film transistor according to any one of 1 to 4, wherein the oxide semiconductor is indium oxide, Ga-doped indium oxide, Al-doped indium oxide, Ga—Al-doped indium oxide, Zn-doped indium oxide, or Sn-doped indium oxide.
6. The thin film transistor according to 5, wherein the Ga-doped indium oxide has an atomic ratio "Ga/(Ga+In)" of 0.007 to 0.207.
7. The thin film transistor according to 5, wherein the Al-doped indium oxide has an atomic ratio "Al/(Al+In)" of 0.003 to 0.125.
8. The thin film transistor according to any one of 1 to 7, the thin film transistor having a bottom-gate structure.
9. The thin film transistor according to 8, further including a protective layer that is formed on the channel layer.
10. The thin film transistor according to 9, wherein the protective layer is an insulating film having oxygen permeability.
11. The thin film transistor according to any one of 1 to 7, the thin film transistor having a top-gate structure.

The thin film transistor according to aspect of the invention may be produced by the following method.

[1] A method for producing a thin film transistor including:
   forming a gate electrode;
   forming a gate insulating film on the gate electrode;
   forming a channel layer on the gate insulating film; and
   forming a source electrode and a drain electrode so as to come in contact with the channel layer.
[2] The method for producing a thin film transistor according to [1], the forming of the channel layer including (1) forming the channel layer by sputtering using a target formed of a metal oxide in a noble gas atmosphere including water or hydrogen, (2) forming the channel layer by sputtering using a target formed of a metal oxide in a gas atmosphere including at least a rare gas atom, an oxygen molecule, and a hydrogen molecule, or (3) forming the channel layer by sputtering using a target formed of a metal oxide, and reducing the channel layer after forming the source electrode and the drain electrode.

Note that the channel layer may be reduced before forming the source electrode and the drain electrode. The channel layer may be reduced by utilizing a reducing atmosphere used when forming an insulating film on the channel layer by CVD.

[3] The method for producing a thin film transistor according to [1], further including forming an oxygen-permeable insulating film on the channel layer after forming the source electrode and the drain electrode.

When producing an etch stop-type transistor structure, the oxygen-permeable insulating film may be formed before or after forming the source electrode and the drain electrode as long as the oxygen-permeable insulating film comes in contact with the channel layer.

[4] The method for producing a thin film transistor according to [3], further including performing heat treatment at a temperature selected from the range of 150 to 500° C. after forming the oxygen-permeable insulating film.
[5] A method for producing a thin film transistor including:
   forming a source electrode and a drain electrode on an insulating substrate;
   forming a channel layer so that the channel layer comes in contact with the source electrode and the drain electrode;
   forming a gate insulating film on the channel layer; and
   forming a gate electrode on the gate insulating film.
[6] The method for producing a thin film transistor according to [5], the forming of the channel layer including forming an oxide semiconductor layer by sputtering using a target formed of a single oxide of a metal(s) in a noble gas atmosphere including water, hydrogen, or oxygen.
[7] The method for producing a thin film transistor according to [6], further including performing heat treatment in one or more atmospheres selected from air, an oxygen atmosphere, an oxygen-containing nitrogen gas atmosphere, and an oxygen-containing noble gas atmosphere after forming the channel layer.
[8] The method for producing a thin film transistor according to [7], further including performing one or more treatments selected from an oxygen plasma treatment, an $N_2O$ plasma treatment, and an ozone treatment after the heat treatment.

[9] The method for producing a thin film transistor according to [7] or [8], further including performing one or more treatments selected from a hydrogen plasma treatment, reverse sputtering in a noble gas atmosphere, electron beam irradiation, and UV irradiation after the heat treatment according to [7] or the treatment according to [8].

[10] The method for producing a thin film transistor according to any one of [5] to [9], wherein the gate insulating film is formed by CVD or sputtering at 300° C. or less.

[11] A method for producing a thin film transistor including subjecting the thin film transistor to heat treatment at a temperature selected from the range of 150 to 500° C.

The invention thus provides a thin film transistor that exhibits high mobility and a large on-off ratio. The invention thus also provides a thin film transistor that can be efficiently produced using a single oxide semiconductor material.

DESCRIPTION OF EMBODIMENTS

Exemplary embodiments of the invention are described in detail below with reference to the drawings. Note that the invention is not limited to the following exemplary embodiments, and the configuration and the details thereof may be modified in various ways.

First Embodiment

Figure 1:
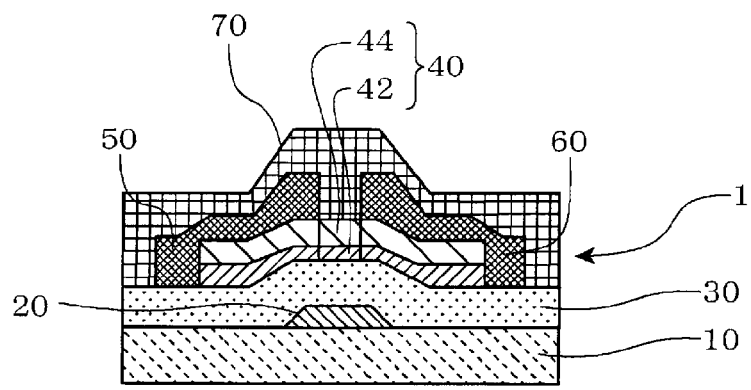
FIG. 1 is a schematic cross-sectional view illustrating a bottom-gate thin film transistor according to one embodiment of the invention.

FIG. 1 is a schematic cross-sectional view illustrating a bottom-gate inverted-staggered thin film transistor according to a first embodiment of the invention.

A thin film transistor 1 illustrated in FIG. 1 includes a gate electrode 20, a source electrode 50, and a drain electrode 60 that are formed on a substrate 10. A gate insulating film 30 is formed to come in contact with the gate electrode 20. The source electrode 50 and the drain electrode 60 are formed on the gate insulating film 30, and a channel layer 40 is formed between the source electrode 50 and the drain electrode 60. The channel layer 40 comes in contact with the gate insulating film 30. A protective layer 70 is formed to cover the source electrode 50, the drain electrode 60, and the channel layer 40. The channel layer 40 is positioned between the gate insulating film 30 and the protective layer 70, and comes in contact with the gate insulating film 30 and the protective layer 70. Note that the protective layer 70 need not necessarily be formed.

The channel layer is a region defined by the channel length (i.e., the interval between the source electrode and the drain electrode), the channel width (i.e., the width of the source electrode and the drain electrode), and the thickness of the semiconductor layer.

The channel layer 40 includes a high carrier concentration region 42 and a low carrier concentration region 44, the high carrier concentration region 42 being situated on the side of the gate insulating film and having a carrier concentration higher than the average carrier concentration in the channel layer 40, and the low carrier concentration region 44 being situated opposite to the gate insulating film and having a carrier concentration lower than the average carrier concentration in the channel layer 40.

The high carrier concentration region is a region situated in the vicinity of the gate insulating film, and preferably a strip-shaped region of the channel layer 40 up to a depth of 5 nm from the interface with the gate insulating film 30 (i.e., from the surface of the channel layer 40 that comes in contact with the gate insulating film 30).

The average carrier concentration in the channel layer is $1\times10^{16}/cm^3$ to $5\times10^{19}/cm^3$, preferably $1\times10^{17}/cm^3$ to $5\times10^{19}/cm^3$, and more preferably $1\times10^{18}/cm^3$ to $1\times10^{19}/cm^3$.

The average carrier concentration in the channel layer refers to a value obtained by dividing the total number of carriers present in the channel layer by a product of the channel length, the channel width, and the thickness of the channel layer. If the average carrier concentration in the channel layer exceeds $5\times10^{19}/cm^3$, it may be difficult to implement on-off control by applying a gate field. If the average carrier concentration in the channel layer is less than $1\times10^{18}/cm^3$, high mobility may not be obtained since the high carrier concentration regions are discretely present.

Figure 2:
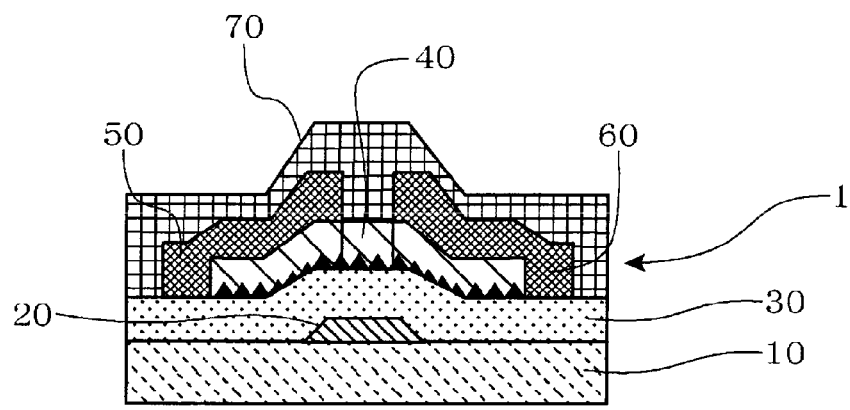
FIG. 2 is a view illustrating a high carrier concentration region.
Figure 3:
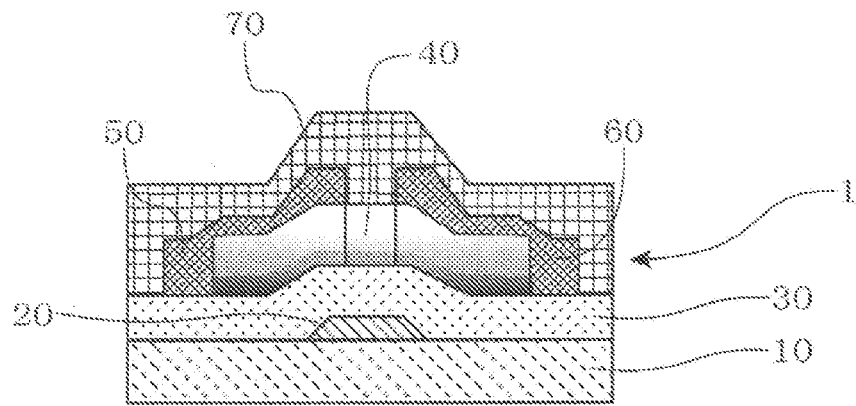
FIG. 3 is a view illustrating a high carrier concentration region.
Figure 4:
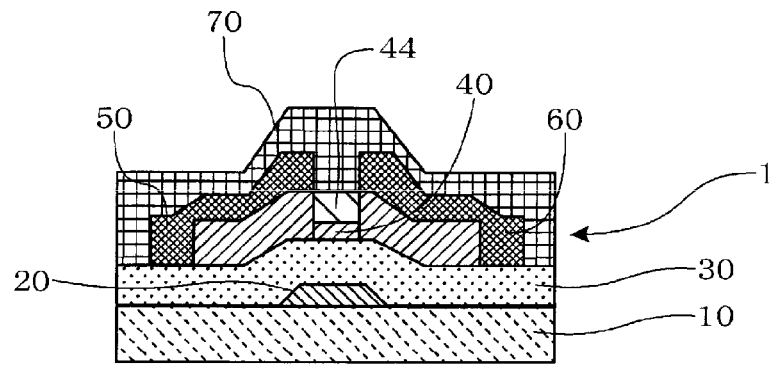
FIG. 4 is a view illustrating a high carrier concentration region.

The high carrier concentration region (particularly a region of the channel layer up to a depth of about 5 nm from the interface with the gate insulating film) may have a uniform carrier concentration over the high carrier concentration region, or may have a non-uniform carrier concentration (see FIG. 2). The high carrier concentration region may have a configuration in which the carrier concentration gradually decreases in the thickness direction from the gate insulating film 30 toward the side opposite to the gate insulating film 30 (see FIG. 3). Alternatively, the high carrier concentration region may have a configuration in which only an area that comes in contact with the protective layer has a low carrier concentration (see FIG. 4). In each case, the high carrier concentration region is a strip-shaped region up to a given depth from the interface with the gate insulating film 30, and the carrier concentration in the high carrier concentration region is higher than the average carrier concentration over the entire channel layer.

Since a region of the channel layer up to a depth of 5 nm from the interface with the gate insulating film is considered to be a region where carrier transfer occurs, it is preferable that the above region be the high carrier concentration region from the viewpoint of obtaining high mobility. The term "strip-shaped" used herein means that the high carrier concentration region is not present in a massive form. It suffices that the high carrier concentration region be present in the vicinity of the gate insulating film so as not to hinder carrier transfer. Accordingly, it is preferable that the high carrier concentration region be a strip-shaped region.

It is preferable that the high carrier concentration region have an average carrier concentration of $1\times10^{18}/cm^3$ to $5\times10^{21}/cm^3$, and more preferably $2\times10^{18}/cm^3$ to $5\times10^{20}/cm^3$.

With regard to the average carrier concentration in the high carrier concentration region of the channel layer, the average carrier concentration of a region of the channel layer up to a depth of, for example, about 5 nm from the interface with the gate insulating film refers to a value obtained by dividing the total number of carriers present in the high carrier concentration region by "channel length×channel width×5 nm". The high carrier concentration region may include an area having an average carrier concentration of less than $1\times10^{18}/cm^3$, or an area having an average carrier concentration of more than $5\times10^{21}/cm^3$.

For example, when the average carrier concentration in the high carrier concentration region is $1\times10^{18}$ to $5\times10^{21}/cm^3$, the average carrier concentration in the channel layer is $1\times10^{16}$ to $5\times10^{19}/cm^3$, and the average carrier concentration in the high carrier concentration region is higher than the average carrier concentration in the channel layer, it is possible to implement a thin film transistor that achieves a field-effect mobility of 40 $cm^2/V\cdot s$ or more and an on-off ratio of $10^7$. For example, when the average carrier concentration in the high carrier concentration region is $3\times10^{18}$ to $5\times10^{20}/cm^3$, and the average carrier concentration in the channel layer is $1\times10^{17}$ to $5\times10^{18}/cm^3$, it is possible to implement a thin film transistor that achieves a field-effect mobility of 80 $cm^2/V\cdot s$ or more and an on-off ratio of $10^8$.

In the first embodiment, a first side of the channel layer situated on the side of the gate insulating film normally has a carrier concentration higher than that of a second side of the channel layer situated opposite to the first side.

The average carrier concentration in the channel layer and the average carrier concentration in the high carrier concentration region may be determined by measurement using a scanning spread resistance microscope (SSRM). The average carrier concentration in the channel layer may be determined by a Hall effect measurement method.

The thickness of the channel layer is normally 10 to 200 nm, preferably 15 to 150 nm, more preferably 20 to 100 nm, still more preferably 25 to 80 nm, and particularly preferably 30 to 50 nm. If the thickness of the channel layer is less than 10 nm, the thickness may be non-uniform when forming the channel layer over a large area, and the characteristics of the resulting TFT may show in-plane non-uniformity. If the thickness of the channel layer exceeds 200 nm, it may take time to form the channel layer, and the industrial productivity may deteriorate.

The channel layer is formed of an oxide semiconductor having a substantially homogeneous composition. The oxide semiconductor preferably has a crystalline structure.

The expression "substantially homogeneous composition" used herein in connection with the channel layer (oxide semiconductor) means that only one type of sputtering target or solution is used to produce the channel layer. The expression "substantially homogeneous composition" used herein in connection with the channel layer (oxide semiconductor) also means that the ratio of the metal elements included in the channel layer (excluding the metal elements included in the electrode/insulating film that comes in contact with the channel layer) is identical in the thickness direction by 80% or more, preferably 85% or more, and particularly preferably 90% or more. The ratio of the metal elements in the thickness direction may be determined by depth resolved XPS, SIMS, or the like. Note that the ratio of the metal elements included in the channel layer may be difficult to determine in an area near the interface with the gate insulating film. In this case, it is considered that the ratio of the metal elements included in the channel layer is identical when the spectral intensity of the metal element smoothly attenuates from the bulk direction of the channel layer toward the insulating film.

Examples of a material for forming the channel layer include indium oxide, Ga-doped indium oxide, Al-doped indium oxide, Ga—Al-doped indium oxide, Zn-doped indium oxide, and Sn-doped indium oxide. Further examples of the material for forming the channel layer include In, Zn, and a third element, the third element being one or more metal elements selected from Sn, Ga, Hf, Zr, Ti, Al, Mg, Ge, Sm, Nd, and La.

It is preferable to select the material for forming the channel layer from indium oxide, Ga-doped indium oxide, Al-doped indium oxide, Ga—Al-doped indium oxide, Zn-doped indium oxide, and Sn-doped indium oxide since a thin film transistor can be obtained that exhibits high mobility and has a large on-off ratio.

A material for forming the gate insulating film is not particularly limited. A known material may be arbitrarily selected as the material for forming the gate insulating film. For example, a compound such as $SiO_2$, $SiN_x$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $HfO_3$, $CaHfO_3$, $PbTiO_3$, $BaTa_2O_6$, $SrTiO_3$, or AlN may be used as the material for forming the gate insulating film. Among these, $SiO_2$, $SiN_x$, $Al_2O_3$, $Y_2O_3$, $HfO_2$, and $CaHfO_3$ are preferable, and $SiO_2$, $SiN_x$, $Y_2O_3$, $HfO_2$, and $CaHfO_3$ are more preferable. Note that the number of oxygen atoms of these oxides need not necessarily coincide with that of the stoichiometric ratio (e.g., either $SiO_2$ or $SiO_x$ may be used).

A material for forming each electrode (i.e., drain electrode, source electrode, and gate electrode) is not particularly limited. A known material may be arbitrarily selected as the material for forming each electrode. For example, a transparent electrode material (e.g., ITO, indium zinc oxide, ZnO, or $SnO_2$), a metal electrode material (e.g., Al, Ag, Cu, Cr, Ni, Mo, Au, Ti, or Ta), or an alloy thereof may be used to form each electrode. Each electrode (i.e., drain electrode, source electrode, and gate electrode) may have a multilayer structure in which two or more different conductive layers are stacked. The source electrode and the drain electrode may have a structure in which a good conductor (e.g., Al or Cu) is sandwiched between metals that exhibit excellent adhesion (e.g., Ti or Mo) since a reduction in resistance is desired.

In the invention, the substrate and the gate electrode may be formed of an identical material (see the examples). Note that the substrate and the electrode may be formed of a different material. In this case, it is preferable to use an insulating substrate. Examples of the insulating substrate include glass substrates such as a non-alkali glass substrate produced by a fusion method or a float method (e.g., barium borosilicate glass, alumino-borosilicate glass, and aluminosilicate glass), ceramic substrates, plastic substrates having heat resistance sufficient to endure the process temperature employed in the production process, and the like. A substrate in which an insulating film is formed on the surface of a metal substrate (e.g., stainless steel alloy) may also be used. When the substrate is mother glass, the size of the substrate may be the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), or the like. An insulating film may be formed on the substrate as a base film. The base film may be formed by silicon oxide film, silicon nitride film, silicon nitride oxide film, or silicon oxide nitride film as a single-layer or multi-layer using a CVD method, a sputtering method or the like, for example.

A silicon substrate provided with a thermal oxide film may be considered to be a substrate provided with a gate insulating film and a gate electrode wherein the gate insulating film is the thermal oxide film, and the gate electrode is silicon.

As described above, the channel layer included in the thin film transistor according to the first embodiment has a high average carrier concentration, and has a configuration in which the layer situated on the side of the gate insulating film has a higher carrier concentration.

Since the main carrier conduction path in the thin film transistor is the vicinity of the interface with the gate insulating film, the transfer characteristics (mobility and on-off ratio) of the thin film transistor are significantly affected by the state of the oxide semiconductor region present in the vicinity of the interface with the gate insulating film. In the first embodiment, since a region having a high carrier concentration is formed in the vicinity of the gate insulating film, a high maximum current value is obtained when the on operation is performed. It has been known that an oxide semiconductor having a high carrier concentration normally tends to have a high mobility (see Wager et al., "Transparent Electronics", Springer, N.Y., p. 129), and the mobility of a thin film transistor derived from the above transfer characteristics is also high. The mobility of the thin film transistor is preferably 40 cm$^2$/Vs or more, and more preferably 80 cm$^2$/Vs or more.

In the thin film transistor according to the first embodiment, the conductivity of the back channel-side low carrier concentration region is lower than that of a region in the vicinity of the gate insulating film. Therefore, conduction on the back channel side where electrons are easily accumulated when a negative voltage is applied to the gate electrode is suppressed, and a transistor having a low off current can be obtained.

Therefore, the thin film transistor according to the invention exhibits high mobility and a large on-off ratio.

The subthreshold factor (S-factor) is a factor that is correlated with the degree of change in transfer characteristics from the off state to the on state. A small subthreshold factor indicates that the degree of change in transfer characteristics from the off state to the on state is steep. It has been known that electrons present in the vicinity of the surface of the insulating layer are induced when sweeping the gate voltage from negative to positive contribute to conduction by utilizing the localized acceptor-like level in the bandgap or the interface state of the oxide semiconductor and the surface of the insulating film, whereby the rising edge of the transfer curve is rounded, and a good subthreshold factor is not obtained.

When a high carrier concentration layer is formed to come in contact with (or formed in the vicinity of) the surface of the gate insulating film, such a level is occupied more promptly, and a good subthreshold factor is obtained. Moreover, a good subthreshold factor is obtained due to a reduction in the current value in the off region (see above).

It is known that carriers present in an oxide semiconductor are derived from oxygen deficiencies. When the carrier concentration on the back channel side (i.e., the side that does not come in contact with the gate insulating film) of the oxide semiconductor layer is low, the amount of oxygen deficiencies on the back channel side is small.

Since it is considered that the stability of the thin film transistor performance to bias stress and photoirradiation has a correlation with the amount of oxygen deficiencies present on the front channel side or the back channel side, a highly reliable thin film transistor that exhibits excellent bias stress resistance and light stability may be obtained by reducing the carrier concentration on the back channel side.

It has been known that an oxide semiconductor layer having a high carrier concentration has an effect of reducing potential barriers at a grain boundary or in a crystallite (see J. Appl. Phys., vol. 94, p. 7768 (2003)). Therefore, it is considered that a variation in in-plane characteristics due to the barrier can be reduced, and a thin film that exhibits in-plane uniformity from the viewpoint of the TFT characteristics can be formed.

Since the channel layer according to the first embodiment has a substantially homogenous composition, a film having a carrier concentration gradient relative to the thickness can be formed using a single sputtering target or solution. Therefore, an, improvement in productivity and a reduction in cost can be achieved.

The thin film transistor according to the first embodiment may be disposed on a substrate, and used as a thin film transistor substrate. The thin film transistor according to the first embodiment may also be used for an image display.

The channel layer included in the thin film transistor according to the first embodiment may be produced by a method that includes the following step (1), (2), or (3).
(1) An oxide semiconductor layer is formed by sputtering using a target formed of a single oxide of a metal(s) in a noble gas atmosphere including water or hydrogen.
(2) An oxide semiconductor layer is formed by sputtering using a target formed of a single oxide of a metal(s) in a gas atmosphere including at least a rare gas atom, an oxygen molecule, and a hydrogen molecule.
(3) An oxide semiconductor layer is formed by sputtering using a target formed of a single oxide of a metal(s), and reduced.

The reduction treatment in the step (3) is preferably implemented by vacuum annealing, a hydrogen plasma treatment, UV irradiation, or water vapor annealing. It is particularly preferable to use water vapor annealing. It is preferable to perform water vapor annealing at a temperature of 150° C. to 500° C. under a pressure of 1 to 3 MPa. Since the carrier concentration in the thin film can be increased by the above treatment, a channel layer having a carrier concentration of $1 \times 10^{18}$/cm$^3$ or more can be obtained even if the carrier concentration immediately after forming the oxide semiconductor film is less than $1 \times 10^{18}$/cm$^3$.

When using the step (1), hydrogen ions and hydrogen radicals are produced in plasma to achieve a reduction effect, and the carrier concentration in the resulting semiconductor thin film increases. Since it is possible to reduce the amount of oxygen ions that are released from the target and collide with the substrate at a high speed, a high-quality semiconductor thin film can be formed. The carrier concentration after heating can be controlled over a wide range of $10^{15}$ to $10^{22}$/cm$^3$ by adjusting the annealing time. In particular, a region having a carrier concentration of $1 \times 10^{18}$ to $5 \times 10^{21}$/cm$^3$ can be stably formed.

The partial pressure ratio of water molecules to rare gas atoms is represented by "[H$_2$O]/[(H$_2$O]+[rare gas atom])". Note that [H$_2$O] is the partial pressure of water molecules in the gas atmosphere, and [rare gas atom] is the partial pressure of rare gas atoms in the gas atmosphere. The partial pressure ratio is preferably 0.1 to 10%, more preferably 0.5 to 7.0%, still more preferably 1.0 to 5.0%, and particularly preferably 1.0 to 3.0%. If the partial pressure ratio of water molecules to rare gas atoms is less than 0.1%, production of hydrogen ions and hydrogen radicals in plasma may not be suppressed, and the carrier concentration in the film before heating may decrease. As a result, a channel layer having the desired carrier concentration may not be obtained after heat treatment performed subsequent to forming the protective layer. If the partial pressure ratio of water molecules to rare gas atoms exceeds 10%, water may be removed from the thin film during heat treatment, and the density of the oxide semiconductor film may decrease. As a result, the mobility of the resulting TFT may decrease. Note that the rare gas atom is not particularly limited, but is preferably an argon atom. The atmosphere may include oxygen and nitrogen in addition to the noble gas and water as long as the resulting TFT is not adversely affected.

The channel layer may be formed by the step (2) instead of the step (1). When using the step (2), it is preferable that the gas atmosphere during sputtering include hydrogen atoms in an amount (molar ratio) equal to or larger than twice that of oxygen atoms. This makes it possible to achieve an effect similar to that achieved when introducing water into the gas atmosphere.

The channel layer may be formed by the step (3) instead of the step (1) or (2). When the channel layer is not reduced using the step (1), (2), or (3), the channel layer may be reduced by forming an oxygen-permeable insulating film that comes in contact with the channel layer by CVD or sputtering. For example, when forming the oxygen-permeable insulating film by sputtering, the insulating film is implanted into the channel layer to produce oxygen deficiencies by adjusting the output and the sputtering pressure. As a result, the carrier concentration in the channel layer increases (i.e., a reduction effect is achieved). When forming the oxygen-permeable insulating film by CVD, the channel layer can be reduced by introducing a hydrogen-containing gas, and adjusting the substrate temperature and the introduction ratio.

After performing the step (1), (2), or (3), the carrier concentration in the channel layer is reduced sequentially from the side of the gate insulating film in the thickness direction by performing heat treatment after forming the protective layer to adjust the average carrier concentration in the oxide semiconductor channel layer in a region up to a depth of 5 nm from the interface with the gate insulating film within the range of $1\times10^{18}/cm^3$ to $5\times10^{21}/cm^3$.

The thin film transistor according to the first embodiment may be produced as described below, for example.

Specifically, a gate metal film is formed on an insulating substrate, and patterned to form a gate electrode, and a gate insulating film that covers the gate electrode is formed on the insulating substrate.

An oxide semiconductor film is formed on the gate insulating film.

It is preferable to form the oxide semiconductor film by sputtering using a target formed of a metal oxide in a noble gas atmosphere including water or hydrogen. A thin film formed by the above operation is characterized in that oxygen rarely bonds to the thin film, and the thin film has a high carrier concentration.

The oxide semiconductor film is patterned to have the desired shape to form a channel layer.

A source/drain film is formed over the channel layer, and patterned to form source/drain electrodes (i.e., one of the source/drain electrodes is a source electrode, and the other is a drain electrode).

A protective layer is formed to cover the source/drain electrodes, and cover the channel layer between the source/drain electrodes. It is preferable that the protective layer be an insulating film that comes in contact with the channel layer, and has oxygen permeability (hereinafter may be referred to as "oxygen-permeable insulating film"). Examples of the oxygen-permeable insulating film include films respectively formed of $SiO_2$, $SiON$, $Al_2O_3$, $Ta_2O_5$, $TiO_2$, $MgO$, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTiO_3$, $BaTa_2O_6$, $SrTiO_3$, and the like. Among these, $SiO_2$, $SiON$, $Al_2O_3$, $Y_2O_3$, $Hf_2O_3$, and $CaHfO_3$ are preferable, and $SiO_2$ and $Al_2O_3$ are more preferable. The number of oxygen atoms of these oxides need not necessarily coincide with that of the stoichiometric ratio (e.g., $SiO_2$ or $SiO_x$ may be used). The oxygen-permeable insulating film is formed using a plasma CVD method or a sputtering method. The oxygen-permeable insulating film is preferably formed using a sputtering method in a noble gas atmosphere including oxygen.

The oxygen-permeable insulating film may be formed before forming the source/drain film (e.g., etch stop-type).

The channel layer is then optionally subjected to heat treatment. The channel layer is preferably subjected to heat treatment in air, an oxygen atmosphere, an oxygen-containing nitrogen gas atmosphere, or an oxygen-containing noble gas atmosphere. An arbitrary heat treatment device may be used when subjecting the channel layer to heat treatment. For example, a lamp annealer (LA), a rapid thermal annealer (RTA), or a laser annealer may be used. The above operation introduces oxygen into the channel layer from the back channel side through the oxygen-permeable insulating film, and the carrier concentration decreases sequentially from the side of the gate insulating film in the thickness direction.

It is undesirable to perform a process that reduces the carrier concentration in the oxide semiconductor film or the channel layer during a period from the formation of the oxide semiconductor film to the formation of the oxygen-permeable insulating film. For example, when atmospheric annealing is performed before forming the oxygen-permeable insulating film, oxygen is rapidly introduced into the channel layer, and the carrier concentration in the channel layer decreases uniformly. This makes it difficult to form a high carrier concentration region in the vicinity of the interface with the gate insulating film. In this case, however, the carrier concentration in the channel layer can be increased by performing reduction annealing in a hydrogen-containing inert gas, annealing in a high-pressure water vapor atmosphere, or the like before forming the oxygen-permeable insulating film, and the desired channel layer can be obtained by performing heat treatment after forming the oxygen-permeable insulating film. An oxygen-blocking insulating film (e.g., SiNx or AlN) may be formed after performing heat treatment subsequent to forming the oxygen-permeable insulating film.

Second Embodiment

In the first embodiment, both a crystalline oxide and an amorphous oxide can be used for the channel layer. In a second embodiment, a crystalline oxide is used for the channel layer. The second embodiment is the same as the first embodiment, except that the oxide used for the channel layer is limited to a crystalline oxide.

A crystalline oxide semiconductor layer used in connection with the second embodiment is characterized in that the oxide semiconductor layer has an amorphous structure, and has a carrier concentration of $5\times10^{18}/cm^3$ or more immediately after forming the oxide semiconductor layer, but the structure of the semiconductor layer changes into a crystalline structure by performing heat treatment after forming the oxygen-permeable insulating film as the protective layer.

The average carrier concentration in a specific region of the channel layer (e.g., a region of the channel layer up to a depth of 5 nm from the interface with the gate insulating film) can be adjusted within the range of $1\times10^{18}/cm^3$ to $5\times10^{21}/cm^3$ through heating/crystallization.

In the second embodiment, it is preferable to form the channel layer by sputtering in an atmosphere of a mixed gas including rare gas atoms and one or more molecules selected from water molecules and hydrogen molecules, and it is particularly preferable to form the channel layer by sputtering in an atmosphere of a mixed gas including rare gas atoms and water molecules, for example. In this case, the oxide semiconductor layer has an amorphous structure, and has a carrier concentration of $1\times10^{18}/cm^3$ or more immediately after forming the oxide semiconductor layer. The term "amorphous" used herein means that a halo pattern is observed (i.e., the crystal structure cannot be specified) when subjecting the resulting film to X-ray crystal structure analysis. The channel layer subjected to heat treatment is a polycrystalline thin film including crystal grains having a continuous structure.

In the second embodiment, the oxide semiconductor layer is formed of an indium-containing oxide or the like. A material for forming the oxide semiconductor layer is preferably selected from indium oxide, Ga-doped indium oxide, Al-doped indium oxide, Ga—Al-doped indium oxide, Zn-doped indium oxide, and Sn-doped indium oxide. The term "doped indium oxide" used herein refers to indium oxide to which a metal atom or a metal atom-containing compound is added. The atomic ratio of the metal atom or the metal atom-containing compound relative to indium oxide may exceed 0.5.

A thin film transistor that exhibits excellent optical characteristics can be obtained by utilizing a crystalline material for the channel layer. When using an oxide semiconductor formed of a crystalline material for the channel layer, it is expected that the bandgap of the channel layer is 3.5 eV or more. Therefore, stable characteristics can be maintained even when stray light (e.g., backlight or organic EL) is applied during the operation of the thin film transistor. When using indium oxide doped with Ga or Al as the crystalline material, a bandgap of 3.7 eV or more is expected to be achieved.

Spectroscopic ellipsometry has been known as a typical technique for evaluating the bandgap of a material. Specifically, linearly polarized light is caused to be incident on a sample, and the polarization state (normally elliptically polarized light) of reflected light from the sample is determined, and fitted to an optimum model for expressing the characteristics of the film to measure the refractive index n, the extinction coefficient k (optical constant), the thickness, the surface roughness, the interfacial roughness, and the like of the thin film. Other characteristic values such as the crystallinity, anisotropy, electrical resistivity, and bandgap can also be estimated.

When indium oxide is doped with Ga or Al, the degree of 5 s orbital overlap of In increases due to a decrease in lattice constant, and an increase in mobility is expected to be achieved.

The atomic ratio "Ga/(Ga+In)" of gallium metal and indium metal is preferably 0.007 to 0.207, more preferably 0.02 to 0.12, and still more preferably 0.05 to 0.08. If the atomic ratio "Ga/(Ga+In)" exceeds 0.207, the crystallization temperature of the Ga-doped indium oxide thin film may increase. If the atomic ratio "Ga/(Ga+In)" is less than 0.007, a decrease in lattice constant due to Ga doping may be suppressed, and the effects of Ga doping (i.e., an improvement in mobility) may not be sufficiently achieved.

The atomic ratio "Al/(Al+In)" of aluminum metal and indium metal is preferably 0.003 to 0.125, more preferably 0.01 to 0.04, and still more preferably 0.01 to 0.03. If the atomic ratio "Al/(Al+In)" exceeds 0.125, Al may not be solid-dissolved in the In site, and may precipitate at the crystal grain boundaries, for example. If the atomic ratio "Al/(Al+In)" is less than 0.003, a decrease in lattice constant due to Al doping may be suppressed, and the effects of Al doping (i.e., an improvement in mobility) may not be sufficiently achieved.

The atomic ratio "Zn/(Zn+In)" in Zn-doped indium oxide is preferably 0.01 to 0.8, and more preferably 0.01 to 0.07. If the atomic ratio "Zn/(Zn+In)" exceeds 0.8, Zn may not be solid-dissolved in the In site, and may precipitate at the crystal grain boundaries, for example.

The atomic ratio "Sn/(Sn+In)" in Sn-doped indium oxide is preferably 0.001 to 0.05, and more preferably 0.002 to 0.02. If the atomic ratio "Sn/(Sn+In)" exceeds 0.05, Sn that is solid-dissolved in In may serve as a donor, and a semiconductor may not be obtained due to an increase in carrier concentration.

The atomic ratio of the elements included in the thin film may be determined by quantitatively analyzing the elements using an inductively coupled plasma atomic emission spectrometer (ICP-AES).

Specifically, when a solution sample is nebulized using a nebulizer, and introduced into an argon plasma (about 6000 to 8000° C.), each element included in the sample absorbs the thermal energy, and is excited, and the orbital electrons migrate from the ground state to the orbital at a high energy level. The orbital electrons then migrate to the orbital at a lower energy level when about $10^{-7}$ to about $10^{-8}$ seconds has elapsed. In this case, the difference in energy is emitted as light. Since the emitted light has an element-specific wavelength (spectral line), the presence or absence of each element can be determined based on the presence or absence of the spectral line (qualitative analysis).

Since the size of each spectral line (luminous intensity) is in proportion to the number (content) of elements included in the sample, the element concentration in the sample can be determined by comparison with a standard solution having a known concentration (quantitative analysis).

After specifying the elements included in the sample by qualitative analysis, the content of each element is determined by quantitative analysis, and the atomic ratio of the elements is calculated from the results.

In order to reduce the electrical resistance of the sputtering target, an element that may have a positive valence of 4 or more, such as Sn, Ti, Si, Ce, or Zr, may be added to the oxide semiconductor target in a ratio of 3 wt % or less. In particular, Sn has a significant effect of improving the sintering density, and reducing the electrical resistance of the target. The content of the element that may have a positive valence of 4 or more is preferably 2 wt % or less, and particularly preferably 1 wt % or less. If the content of the element that may have a positive valence of 4 or more exceeds 3 wt %, it may be difficult to reduce the carrier concentration in the oxide semiconductor film.

The oxide semiconductor layer substantially consists of the above oxide. Specifically, the oxide semiconductor layer may include unavoidable impurities in addition to the above oxide.

The oxide semiconductor layer according to the second embodiment may be formed by DC (direct-current) sputtering, AC (alternating-current) sputtering, RF sputtering, pulsed DC sputtering, or the like. DC sputtering has an advantage in that the power supply device can be simplified. AC sputtering has an advantage in that excellent large-area uniformity can be achieved on an industrial scale, and the utilization efficiency of the target can be improved. RF sputtering has an advantage in that mild sputtering target sintering conditions can be employed since discharge occurs even if the target has high resistance.

The substrate temperature when forming the oxide semiconductor layer by sputtering is preferably 0 to 120° C., more preferably 10 to 100° C., and particularly preferably 20 to 90° C. If the substrate temperature when forming the oxide semiconductor layer by sputtering is more than 120° C., microcrystals may be formed in the thin film immediately after forming the thin film, and the average carrier concentration in the channel layer after heating/crystallization may exceed $5\times10^{19}/cm^3$. If the substrate temperature when forming the oxide semiconductor layer by sputtering is less than 0° C., the mobility of the resulting thin film transistor may decrease due to a decrease in density of the thin film.

The distance between the target and the substrate in the direction perpendicular to the surface of the substrate (on which the oxide semiconductor layer is formed) is preferably 1 to 30 cm, and more preferably 2 to 8 cm. If the distance between the target and the substrate is less than 1 cm, the kinetic energy of the particles of the constituent elements of the target that reach the substrate may increase, and a film having excellent characteristics may not be obtained. Moreover, the thickness and the electrical characteristics may show an in-plane distribution. If the distance between the target and the substrate exceeds 30 cm, the kinetic energy of the particles of the constituent elements of the target that reach the substrate may decrease to a large extent, and a dense film may not be obtained (i.e., excellent semiconductor characteristics may not be obtained).

It is desirable to form the oxide thin film by sputtering in an atmosphere having a magnetic field intensity of 300 to 1500 G. If the magnetic field intensity is less than 300 G, it may be impossible to form an oxide thin film by sputtering using a high-resistance sputtering target due to a decrease in plasma density. If the magnetic field intensity exceeds 1500 G, it may be difficult to appropriately control the thickness and the electrical characteristics of the film.

The pressure (sputtering pressure) of the gas atmosphere is not particularly limited as long as plasma can be stably discharged, but is preferably 0.1 to 3.0 Pa. The sputtering pressure is more preferably 0.1 to 1.5 Pa, and particularly preferably 0.1 to 1.0 Pa. If the sputtering pressure exceeds 3.0 Pa, the density of the thin film may decrease due to a decrease in the mean free path of the sputtered particles. If the sputtering pressure is less than 0.1 Pa, microcrystals may be formed in the film during sputtering. Note that the term "sputtering pressure" refers to the total pressure in the system when starting sputtering after introducing molecules such as argon, water, and oxygen into the system.

When using AC sputtering, an oxide layer that exhibits excellent large-area uniformity can be obtained on an industrial scale, and the utilization efficiency of the target can be improved. When forming the oxide layer on a large-area substrate (i.e., a substrate having a side dimension of more than 1 m), it is preferable to use an AC sputtering system for a large-area substrate such as that disclosed in JP-A-2005-290550. The AC power density when performing AC sputtering using an oxide target is preferably 3 $W/cm^2$ to 20 $W/cm^2$. If the power density is less than 3 $W/cm^2$, it is not economical since the deposition rate is low. If the power density exceeds 20 $W/cm^2$, the target may break. The power density is more preferably 4 $W/cm^2$ to 15 $W/cm^2$. The partial pressure of water during AC sputtering is preferably $5\times10^{-3}$ to $5\times10^{-1}$ Pa. If the partial pressure of water during AC sputtering is $5\times10^{-3}$ Pa or less, microcrystals may be formed in the thin film immediately after forming the thin film. If the partial pressure of water during AC sputtering exceeds $5\times10^{-1}$ Pa, the degree of 5 s orbital overlap of In may decrease due to a significant decrease in film density, and a decrease in mobility may occur. The partial pressure of water during sputtering is preferably $1\times10^{-2}$ Pa to $1\times10^{-1}$ Pa when the power density is 5 $W/cm^2$. The AC sputtering frequency is preferably 10 kHz to 1 MHz. If the AC sputtering frequency is less than 10 kHz, noise may occur. If the AC sputtering frequency exceeds 1 MHz, sputtering may occur at a position other than the desired target position due to an increase in distribution of plasma, whereby uniformity may be impaired. The AC sputtering frequency is more preferably 20 kHz to 500 kHz.

The resulting oxide semiconductor film is subjected to heat treatment at 150 to 500° C. as described below after forming the oxygen-permeable insulating film.

Specifically, the amorphous oxide thin film is subjected to heat treatment (i.e., annealed) to obtain a crystalline oxide thin film. The heat treatment reduces the carrier concentration in the crystalline oxide semiconductor film sequentially from the side of the gate insulating film in the thickness direction while maintaining the high average carrier concentration in the oxide semiconductor channel layer in a specific region from the interface with the gate insulating film.

The heating (annealing) temperature is preferably 150 to 500° C., and more preferably 200 to 350° C. If the heating temperature is less than 150° C., crystallization may be insufficient, and the carrier concentration may not be reduced to the desired value. If the heating temperature exceeds 500° C., the carrier concentration may decrease to a large extent.

The crystallization step and the step that maintain the high carrier concentration in a specific region from the interface with the gate insulating film may be performed separately from each other. For example, the crystallization step may be implemented by heating at 300° C. for 30 minutes, and the step that adjusts the carrier concentration may then be performed at 200° C. for 2 hours.

In the second embodiment, when the amorphous oxide thin film that includes indium oxide and the dopants is subjected to the heat treatment (i.e., annealed), the dopants are solid-dissolved in the indium oxide crystals, and a single-phase bixbyite structure is obtained in which the crystals are arranged in a columnar shape in the thickness direction.

Since the oxide thin film in which the crystals are arranged in a columnar shape has a small crystal misorientation and a low trap density, a thin film transistor that exhibits improved field-effect mobility and a good S-factor (subthreshold factor) can be formed with high reproducibility.

The atmosphere employed when subjecting the amorphous oxide thin film to the heat treatment (annealing) is not particularly limited, but is preferably air, an oxygen atmosphere, an oxygen-containing nitrogen gas atmosphere, an oxygen-containing noble gas atmosphere, or an oxygen-containing inert gas atmosphere, from the viewpoint of carrier control capability. The amorphous oxide thin film may be subjected to the heat treatment (annealing) using a lamp annealer, a laser annealer, a thermal plasma system, a hot-blast heating system, a contact heating system, or the like.

Since the oxide thin film in which the crystals are arranged in a columnar shape rarely includes disordered microcrystals, the lower limit of oxygen deficiencies can be reduced, and the carrier concentration after heating can be controlled over a wide range of $1\times10^{15}$ to $1\times10^{21}/cm^3$ by adjusting the annealing time. This makes it possible to reduce the carrier concentration in the crystalline oxide semiconductor film (sequentially) from the side of the gate insulating film in the thickness direction while adjusting the average carrier concentration in a specific region from the interface with the gate insulating film within the range of $1\times10^{18}/cm^3$ to $5\times10^{21}/cm^3$.

The crystallized oxide semiconductor layer is a thin film that substantially has an $In_2O_3$ bixbyite structure. Note that the expression "substantially has an $In_2O_3$ bixbyite structure" means that 70% or more (preferably 80% or more, and more preferably 85% or more) of the crystal structure of the oxide layer (crystalline oxide semiconductor layer) (crystalline oxide thin film) has a bixbyite structure.

It is desirable that the crystal structure of the oxide semiconductor layer according to the second embodiment substantially have only an indium oxide bixbyite structure. Whether or not the oxide semiconductor layer has an indium oxide bixbyite structure (i.e., formed of indium oxide having a bixbyite structure) may be determined by X-ray diffraction (XRD) measurement.

Intense X-rays are observed in a specific direction when X-rays are incident on a crystal in which atoms are arranged regularly, so that a diffraction phenomenon occurs. Specifically, when the optical path difference of X-rays scattered at each position is an integral multiple of the wavelength of the X-rays, the amplitude of the waves increases since the phases of the waves coincide, and the diffraction phenomenon occurs.

Since a substance forms a crystal having specific regularity, the type of compound can be identified by utilizing X-ray diffraction. It is also possible to evaluate the size of the crystals (crystalline order), the distribution state of the orientation of the crystals present in the material (crystal orientation), and the residual stress applied to the crystals.

The thickness of the channel layer is normally 10 to 200 nm, preferably 15 to 150 nm, more preferably 20 to 100 nm, still more preferably 25 to 80 nm, and particularly preferably 30 to 50 nm. If the thickness of the channel layer is less than 10 nm, non-uniformity in thickness may occur when forming the channel layer over a large area, and the characteristics of the resulting thin film transistor may show in-plane non-uniformity. If the thickness of the channel layer exceeds 200 nm, it may take time to form the channel layer, and industrial application may be difficult.

Third Embodiment

Figure 5:
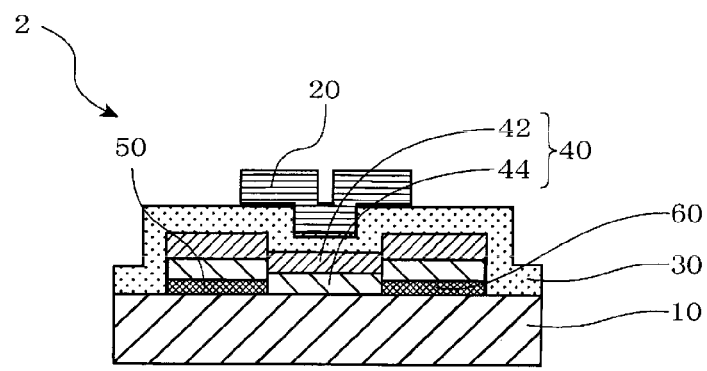
FIG. 5 is a schematic cross-sectional view illustrating a top-gate thin film transistor according to another embodiment of the invention.

FIG. 5 is a schematic cross-sectional view illustrating a top-gate forward-staggered thin film transistor according to a third embodiment of the invention.

A thin film transistor 2 illustrated in FIG. 5 includes a source electrode 50 and a drain electrode 60 that are formed on a substrate 10. A channel layer 40 is formed between the source electrode 50 and the drain electrode 60. A gate insulating film 30 is formed over the substrate 10, the source electrode 50, the drain electrode 60, and the channel layer 40. The channel layer 40 comes in contact with the gate insulating film 30. A gate electrode 20 is formed to come in contact with the gate insulating film 30. The channel layer 40 is enclosed by the gate insulating film 30, the substrate 10, the source electrode 50, and the drain electrode 60, and comes in contact with the gate insulating film 30, the substrate 10, the source electrode 50, and the drain electrode 60.

In the third embodiment, the channel layer 40 includes a high carrier concentration region 42 and a low carrier concentration region 44, the high carrier concentration region 42 being situated on the side of the gate insulating film 30 and having a carrier concentration higher than the average carrier concentration in the channel layer, and the low carrier concentration region 44 being situated opposite to the gate insulating film 30 and having a carrier concentration lower than the average carrier concentration in the channel layer.

The configuration of the channel layer 40 including the high carrier concentration region 42 and the like are the same as described above in connection with the first embodiment.

The thin film transistor according to the third embodiment may be produced as described below, for example.

Specifically, an oxide semiconductor film is formed on an insulating substrate. It is preferable that the oxide semiconductor layer have a thickness of 10 nm or more, and be substantially homogenous. When forming a top-gate structure, it is preferable to form the oxide semiconductor layer by sputtering using a target formed of a metal oxide. The oxide semiconductor layer may be formed in a noble gas atmosphere including oxygen in addition to a noble gas atmosphere including water or hydrogen instead of an atmosphere employed in the first embodiment. The oxide semiconductor layer is then patterned to form a channel layer.

A source electrode and a drain electrode are formed on the insulating substrate so as to come in contact with either end of the channel layer.

The average carrier concentration in the channel layer is preferably adjusted to $5\times10^{19}/cm^3$ or less, more preferably $1\times10^{18}/cm^3$ or less, and still more preferably $1\times10^{17}/cm^3$ or less. When the carrier concentration in the oxide semiconductor layer is high, it is preferable to subject the oxide semiconductor layer to heat treatment in air, an oxygen atmosphere, an oxygen-containing nitrogen gas atmosphere, an oxygen-containing noble gas atmosphere, or an oxygen-containing inert gas atmosphere. When the carrier concentration is not sufficiently reduced by the heat treatment, the average carrier concentration in the channel layer may be adjusted to the desired value by performing an oxygen plasma treatment, an $N_2O$ plasma treatment, or an ozone treatment.

Next, oxygen deficiencies are introduced into the surface of the channel layer formed on the substrate by performing a hydrogen plasma treatment, reverse sputtering in a noble gas atmosphere, electron beam irradiation, or UV irradiation to increase the carrier concentration in a region in the vicinity of the surface of the oxide semiconductor channel layer. It is preferable that the above region have an average carrier concentration of $1\times10^{18}$ to $5\times10^{21}/cm^3$, and more preferably $2\times10^{18}$ to $5\times10^{20}/cm^3$. The average carrier concentration in the channel layer is preferably $1\times10^{16}$ to $5\times10^{19}/cm^3$, and more preferably $1\times10^{17}$ to $5\times10^{19}/cm^3$. For example, when the average carrier concentration in the high carrier concentration region is $1\times10^{18}$ to $5\times10^{21}/cm^3$, the average carrier concentration in the channel layer is $1\times10^{16}$ to $5\times10^{19}/cm^3$, and the average carrier concentration in the high carrier concentration region is higher than the average carrier concentration in the channel layer, it is possible to implement a thin film transistor that achieves a field-effect mobility of 40 cm$^2$/V·s or more and an on-off ratio of $10^7$. For example, when the average carrier concentration in the high carrier concentration region is $3\times10^{18}$ to $5\times10^{20}/cm^3$, and the average carrier concentration in the channel layer is $1\times10^{17}$ to $5\times10^{18}/cm^3$, it is possible to implement a thin film transistor that achieves a field-effect mobility of 80 cm$^2$/V·s or more and an on-off ratio of $10^8$.

Next, a gate insulating film is formed to cover the channel layer, the source electrode, and the drain electrode formed on the substrate. A gate electrode is formed on the gate insulating film. The gate electrode is situated over the channel layer.

It is undesirable to perform a process that changes the carrier concentration in the oxide semiconductor film when forming the gate insulating film. For example, when forming the gate insulating film using a plasma CVD process, hydrogen diffuses into the channel layer when the substrate temperature is high, and the carrier concentration in the channel layer increases uniformly. This makes it difficult to form a channel layer having the desired average carrier concentration. An oxygen-blocking insulating film (e.g., SiNx or AlN)

may be formed as the gate insulating film in addition to an oxygen-permeable insulating film.

When forming an oxygen-permeable insulating film as the gate insulating film, the carrier concentration in the channel layer can be reduced sequentially from the side of the gate insulating film in the thickness direction by performing heat treatment after forming the gate insulating film to adjust the average carrier concentration in the oxide semiconductor channel layer in a region up to a depth of 5 nm from the interface with the gate insulating film within the range of $1 \times 10^{18}/cm^3$ to $5 \times 10^{21}/cm^3$ when the carrier concentration on the side of the gate insulating film is high even when the carrier concentration has changed when forming the gate insulating film.

EXAMPLES

Example 1

(1) Production of Thin Film Transistor

Figure 6:
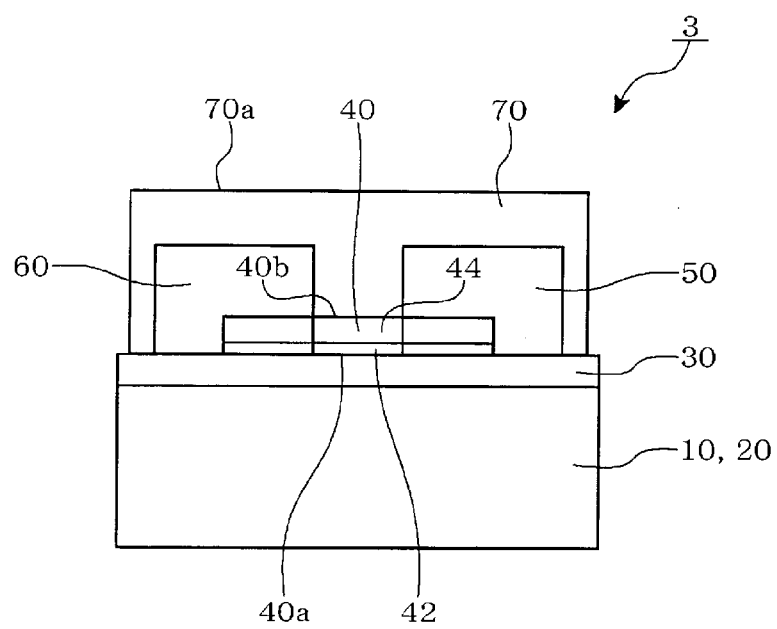
FIG. 6 is a schematic cross-sectional view illustrating a top-gate thin film transistor produced in Example 1.

In Example 1, a bottom-gate (inverted-staggered) TFT as illustrated in FIG. 6 was produced.

An In—Ga—O oxide semiconductor (thickness: 50 nm) (oxide semiconductor layer 40) was deposited by DC sputtering on a low-resistance n-type crystalline silicon substrate (that functions as a substrate and a gate electrode) (10, 20) on which a gate insulating film 30 (thickness: 100 nm) consisting of thermal oxide silicon was formed. A polycrystalline sintered body having an InGaO composition (Ga/(In+Ga) =0.072 (atomic ratio)) was used as a target. The DC power supplied during sputtering was 100 W. The total pressure of the atmosphere during sputtering was 0.4 Pa, the gas flow rate ratio was Ar:H$_2$O=99:1, and the deposition rate was 8 nm/min. The substrate temperature was 25° C.

A channel section 40 (channel length L: 200 μm, channel width W: 1000 μm) was formed on the In—Ga—O oxide semiconductor film 40 deposited on the gate insulating film 30 through a metal mask.

Next, source/drain electrodes 50 and 60 were formed by depositing gold. An SiO$_2$ film 70 (protective layer) was deposited thereon by sputtering to a thickness of 100 nm. The RF power supplied during sputtering was 300 W. The total pressure of the atmosphere during sputtering was 0.4 Pa, the gas flow rate ratio was Ar:O$_2$=70:30, the deposition rate was 2 nm/min and the target-substrate (T-S) distance was 7 cm. The substrate temperature was 25° C.

The above structure was annealed at 300° C. for 1 hour in air to produce a TFT.

(2) Evaluation of TFT

The TFT characteristics of the TFT obtained as described above (see (1)) were determined from a transfer curve obtained in air. It was found that the threshold voltage V$_{th}$ was 0.1 V, the field-effect mobility μ was 125 cm$^2$/V·s, the S-factor was 0.30 V/decade, and the on/off ratio was 10$^9$. The voltage (Vth) shift after applying a voltage of 20 V to the gate at 50° C. for 10,000 seconds was 0.2 V. The transfer curve was measured using a semiconductor parameter analyzer ("Keithley 4200" manufactured by Keithley Instruments Inc.).

(3) Evaluation of Channel Layer of TFT

The TFT obtained as described above (see (1)) was subjected to depth resolved XPS measurement, cross-sectional XPS measurement, X-ray diffraction measurement, and SSRM measurement.

(3a) Depth Resolved XPS Measurement

The channel section 40 was subjected to depth profile analysis using X-ray photoelectron spectroscopy (XPS). Specifically, the XPS spectrum of In·3d5/2, Ga·2p3/2, and Si·2p was measured while excavating the surface by sputtering using Ar ions (accelerating voltage: 1 keV).

A system "Quantum 2000" (manufactured by ULVAC-PHI, Incorporated) was used for XPS analysis. A monochromatized Al Kα line was used as an X-ray source. The pass energy was 29.35 eV.

The excavation operation was performed from the surface 70a of the SiO$_2$ layer 70 to the interface 40a of the channel layer 40 with the gate insulating film through the channel layer 40 so that the sputtering rate of the SiO$_2$ film 70 was 1.7 nm/min. The XPS measurement was performed at intervals of 1.6 nm in the thickness direction.

Figure 7:
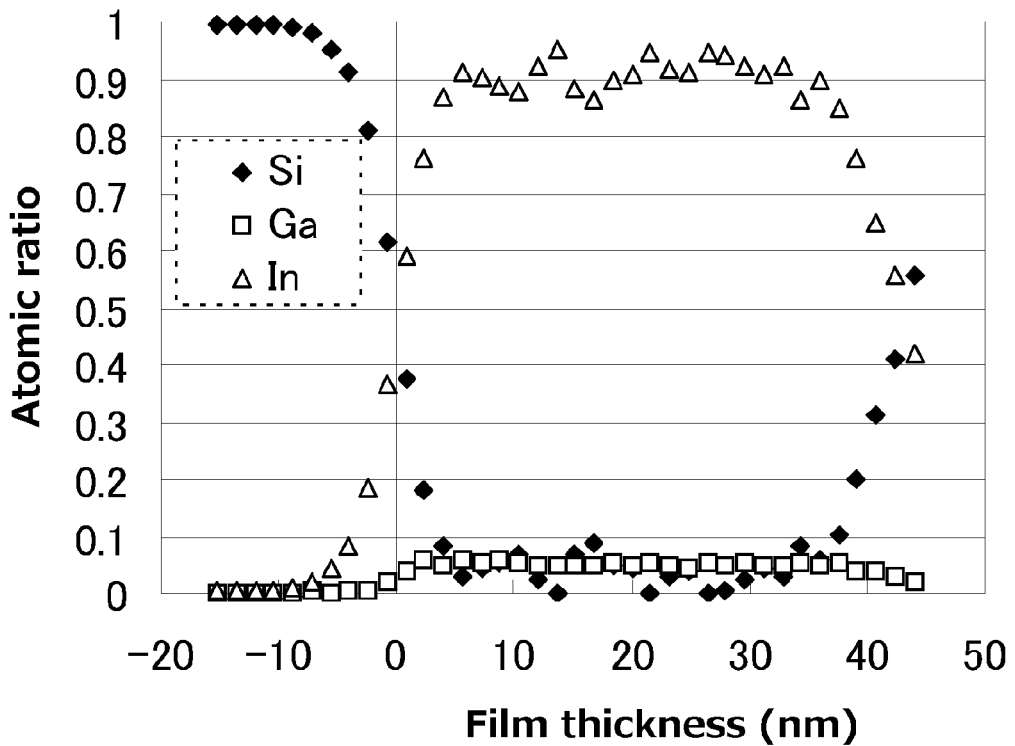
FIG. 7 is a view illustrating the XPS measurement results obtained using the thin film transistor produced in Example 1.

It was found by the XPS measurement that oxygen, silicon, indium, and gallium were present in the oxide semiconductor film 40 from the surface 70a of the SiO$_2$ layer 70 to the interface 40a of the channel layer 40. Carbon was also detected from the surface 70a, but excluded from the measurement results since carbon was merely adsorbed on the surface 70a. As illustrated in FIG. 7 in which the ratio of constituent metal atoms are plotted in the thickness direction, the thickness at which the ratio of silicon (i.e., the constituent metal of the SiO$_2$ layer 70 (protective layer)) and the ratio of indium (i.e., the main metal atom forming the channel layer 40) were reversed was determined to be a protective layer-side interface 40b. The thickness at which the ratio of silicon (i.e., the constituent metal of the SiO$_2$ layer 30 (gate insulating layer)) and the ratio of indium (i.e., the main metal atom forming the channel layer 40) were reversed was determined to be a gate insulating layer-side interface 40a. Note that the atomic ratio (at the surface) was calculated by calculating the peak area of the desired peak (e.g., In·3d5/2, Ga·2p3/2, Si2p, and O1s), and dividing the peak area by the sensitivity coefficient provided by Perkin-Elmer. When calculating the area of the photoelectron peak, the resulting spectral data was subjected to 5-point smoothing using the Savitzky-Golay method to remove the satellite peak of the X-ray source, and the background was removed using the Shirley method.

Figure 8:
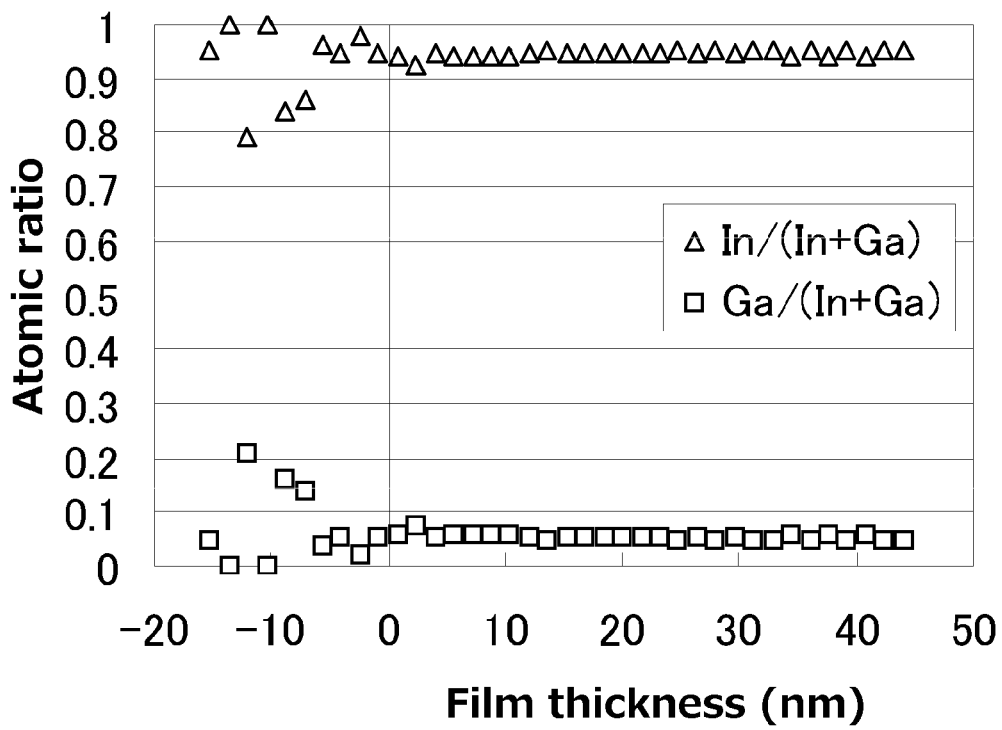
FIG. 8 is a view illustrating the XPS measurement results obtained using the thin film transistor produced in Example 1.

The atomic ratio of indium and gallium (i.e., atoms forming the channel layer) at each depth position was determined. As illustrated in FIG. 7, a plateau was observed between the interface 40a and the interface 40b. Since the ratio of indium and gallium smoothly decreased from the channel toward the interface, the composition was considered to be homogenous in the thickness direction in the interface-plateau region. When the plateau region of indium was determined to be a region at a depth of 5 nm or more from the interface, the ratio of indium (In/(In+Ga)) in the plateau region (see FIG. 8) was 0.951 to 0.940, and the average value was 0.947. Since the ratio of the maximum value to the average value and the ratio of the minimum value to the average value were 1% or less, it was determined that the composition inside the channel layer was also homogenous in the thickness direction. When the plateau region of gallium was determined to be a region at a depth of 5 nm or more from the interface, the ratio of gallium (Ga/(In+Ga)) in the plateau region (see FIG. 8) was 0.060 to 0.047, and the average value was 0.053. Since the ratio of the maximum value to the average value and the ratio of the minimum value to the average value were 15% or less, it was determined that the composition inside the channel layer was also homogenous in the thickness direction.

(3b) Cross-Sectional TEM Measurement and X-Ray Diffraction Measurement

The cross section of the channel section 40 was observed using a transmission electron microscope (TEM). Since an equivalent diffraction pattern was observed in the thickness direction, it was confirmed that the channel section 40 was crystalline in the thickness direction. It was thus confirmed that the channel section 40 was an oxide semiconductor film formed of a crystalline layer having a continuous structure in the thickness direction. It was confirmed by X-ray crystal structure analysis that the crystalline layer was formed of an oxide having a bixbyite-type crystal structure.

(3c) SSRM Measurement

A cross section of the channel section 40 was obtained by underwater mechanical polishing. The cross section was subjected to SSRM measurement. The distribution of the carrier concentration in the thickness direction was determined by comparison with a standard sample having a known carrier concentration. The standard sample had the same device configuration as that of the sample, and included a channel layer having a carrier concentration of $1\times10^{17}$ cm$^{-3}$, $1\times10^{19}$ cm$^{-3}$, or $5\times10^{19}$ cm$^{-3}$. The channel layer of the standard sample was obtained by sputtering using the target of Example 1. The carrier concentration in the standard sample was adjusted by changing the sputtering conditions and the annealing conditions. When the carrier concentration in the channel layer in the vicinity of the interface with the gate insulating film increases, the SSRM image is observed so that the thickness of the gate insulating film decreases. When the apparent thickness of the gate insulating film determined from the SSRM image of the standard sample and the SSRM image of the sample was compared, the apparent thickness of the gate insulating film in the sample was between $1\times10^{19}$ cm$^{-3}$ and $5\times10^{19}$ cm$^{-3}$ of the standard sample. Therefore, the average carrier concentration in a region up to a depth of 5 nm from the interface with the gate insulating film was determined to be $3\times10^{19}$ cm$^{-3}$. Since the thickness of the protective layer of the standard sample having a carrier concentration of $1\times10^{17}$ cm$^{-3}$ was smaller than that of the sample, it was confirmed that the carrier concentration in a region of the channel layer in the vicinity of the protective layer was $1\times10^{17}$ cm$^{-3}$ or less. It was thus confirmed that the carrier concentration sequentially decreased in the thickness direction from the side of the gate insulating film, and the average carrier concentration in a region up to a depth of 5 nm from the interface with the gate insulating film was $3\times10^{19}$ cm$^{-3}$.

The measurement equipment and the measurement conditions used are shown below.
Observation system: NanoScope IVa AFM Dimension 3100 Stage AFM System+SSRM Option (manufactured by Digital Instruments, Bruker AXS (former Veeco))
SSRM scan mode: contact mode and spreading resistance simultaneous measurement
SSRM probe (Tip): diamond-coated silicon cantilever
Sample processing: After forming a cross section by mechanical polishing, each layer was short-circuited so that a bias voltage could be applied.
Measurement environment: room temperature in air (4) Hall Measurement of Thin Film on Glass Substrate An oxide semiconductor film, a Hall electrode, and a protective layer were produced in the same manner as in (1), except that a glass substrate was used instead of the low-resistance n-type crystalline silicon substrate (10, 20). The average carrier concentration was measured by the van der Pauw method using a Hall measurement device. It was found that the average carrier concentration in the oxide semiconductor film was $2.6\times10^{18}$/cm$^3$.

The following Hall measurement device and the measurement conditions were used.
Hall measurement device
Resi Test 8310 manufactured by Toyo Corporation
Measurement conditions
Room temperature (about 25° C.), about 0.5 [T], about $10^{-4}$ to $10^{-12}$ A, AC field Hall measurement
Sample shape
10 mm×10 mm

Example 2

A TFT was produced, and evaluated in the same manner as in Example 1, except that a polycrystalline sintered body having an InGaAlO composition (Ga/(In+Ga+Al)=0.058 (atomic ratio), Al/(In+Ga+Al)=0.013 (atomic ratio)) was used as the sputtering target.

It was confirmed by depth resolved XPS measurement, TEM measurement, and X-ray crystal structure analysis that the composition of the oxide semiconductor layer was homogenous in the thickness direction, the oxide semiconductor layer was a crystalline layer having a continuous structure in the thickness direction, and the crystalline layer was formed of an oxide having a bixbyite-type crystal structure. The results are shown in Table 1.

Example 3

A TFT was produced, and evaluated in the same manner as in Example 1, except that a polycrystalline sintered body having an InAlO composition (Al/(In+Al)=0.013 (atomic ratio)) was used as the sputtering target.

It was confirmed that the composition of the oxide semiconductor layer was homogenous in the thickness direction, the oxide semiconductor layer was a crystalline layer having a continuous structure in the thickness direction, and the crystalline layer was formed of an oxide having a bixbyite-type crystal structure. The results are shown in Table 1.

Example 4

A TFT was produced, and evaluated in the same manner as in Example 1, except that a polycrystalline sintered body having an In$_2$O$_3$ composition was used as the sputtering target.

It was confirmed that the composition of the oxide semiconductor layer was homogenous in the thickness direction, the oxide semiconductor layer was a crystalline layer having a continuous structure in the thickness direction, and the crystalline layer was formed of an oxide having a bixbyite-type crystal structure. The results are shown in Table 1.

Example 5

A TFT was produced, and evaluated in the same manner as in Example 1, except that a polycrystalline sintered body having an InZnO composition (Zn/(In+Zn)=0.050 (atomic ratio)) was used as the sputtering target.

It was confirmed that the composition of the oxide semiconductor layer was homogenous in the thickness direction, the oxide semiconductor layer was a crystalline layer having a continuous structure in the thickness direction, and the crystalline layer was formed of an oxide having a bixbyite-type crystal structure. The results are shown in Table 1.

Example 6

A TFT was produced, and evaluated in the same manner as in Example 1, except that a polycrystalline sintered body having an InSnO composition (Sn/(In+Sn)=0.093 (atomic ratio)) was used as the sputtering target.

It was confirmed that the composition of the oxide semiconductor layer was homogenous in the thickness direction, the oxide semiconductor layer was a crystalline layer having a continuous structure in the thickness direction, and the crystalline layer was formed of an oxide having a bixbyite-type crystal structure. The results are shown in Table 1.

Example 7

In Example 7, a bottom-gate (inverted-staggered) TFT as illustrated in FIG. 6 was produced by photolithography.

An oxide semiconductor layer having an InGaO composition (Ga/(In+Ga)=0.072 (atomic ratio)) was deposited by DC sputtering on a low-resistance n-type crystalline silicon substrate on which a gate insulating film was formed (see (1) in Example 1).

A resist was applied to the deposited In—Ga—O oxide semiconductor, pre-baked at 80° C. for 15 minutes, exposed to UV light (intensity: 300 mJ/cm$^2$) via a mask, developed using 3 wt % tetramethylammonium hydroxide, rinsed with purified water, and post-baked at 130° C. for 15 minutes to form a resist pattern having the desired channel shape. The In—Ga—O oxide semiconductor film formed on the substrate provided with the resist pattern was etched using a mixed acid of phosphoric acid, acetic acid, and nitric acid to form islands.

A resist was applied to the substrate, pre-baked at 80° C. for 15 minutes, exposed to UV light (intensity: 300 mJ/cm$^2$) via a mask, developed using 3 wt % tetramethylammonium hydroxide, rinsed with purified water, and post-baked at 130° C. for 15 minutes to form a resist pattern having the desired source/drain electrode shape. After forming a molybdenum layer (thickness: 300 nm) over the entire surface of the substrate, the resist was removed using acetone to obtain a lift-off device having a channel length of 10 μm and a channel width of 20 μm.

An Al$_2$O$_3$ film (protective layer) was deposited thereon by sputtering to a thickness of 100 nm. The RF power supplied during sputtering was 300 W. The total pressure of the atmosphere during sputtering was 0.4 Pa, the gas flow rate ratio was Ar:O$_2$=70:30, the deposition rate was 2 nm/min and the target-substrate (T-S) distance was 7 cm. The substrate temperature was 25° C.

The above structure was annealed at 300° C. for 1 hour in air to produce a TFT.

The resulting TFT was evaluated in the same manner as in Example 1.

It was confirmed that the composition of the oxide semiconductor layer was homogenous in the thickness direction, the oxide semiconductor layer was a crystalline layer having a continuous structure in the thickness direction, and the crystalline layer was formed of an oxide having a bixbyite-type crystal structure. The results are shown in Table 1.

Example 8

In Example 8, a top-gate (forward-staggered) TFT as illustrated in FIG. 5 was produced.

A metal mask was provided on a glass substrate 10, and molybdenum was deposited to form source/drain electrodes 50 and 60 so that a channel section having a channel length L of 200 μm could be formed.

A In—Ga—O oxide semiconductor layer (thickness: 50 nm) (oxide semiconductor layer 40) was deposited by DC sputtering using a polycrystalline sintered body having an InGaO composition (Ga/(In+Ga)=0.072 (atomic ratio)) as a target. The DC power supplied during sputtering was 100 W. The total pressure of the atmosphere during sputtering was 0.4 Pa, the gas flow rate ratio was Ar:H$_2$O=99:1, and the deposition rate was 8 nm/min. The substrate temperature was 25° C.

A channel section 40 (channel length L: 200 μm, channel width W: 1000 μm) was formed on the deposited In—Ga—O oxide semiconductor film 40 through a metal mask. The resulting structure was annealed at 300° C. for 1 hour in air to crystallize the oxide semiconductor layer while reducing the amount of carriers. A region of the channel layer in the vicinity of the surface of the channel layer was subjected to a hydrogen plasma treatment.

A gate insulating film 30 was formed to cover the channel layer 40, the source electrode 50, the drain electrode 60, and the oxide semiconductor film 40. The gate insulating film 30 was formed by depositing an SiO$_2$ film by sputtering to a thickness of 100 nm. The RF power supplied during sputtering was 300 W. The total pressure of the atmosphere during sputtering was 0.4 Pa, the gas flow rate ratio was Ar:O$_2$=70:30, the deposition rate was 2 nm/min and the target-substrate (T-S) distance was 7 cm.

A gate electrode 20 was formed on the gate insulating film 30 using molybdenum. The gate electrode 20 was formed by DC sputtering using a metal mask so that the gate electrode 20 was positioned over the channel layer 40.

The resulting TFT was evaluated in the same manner as in Example 1.

It was confirmed that the composition of the oxide semiconductor layer 40 was homogenous in the thickness direction, the oxide semiconductor layer 40 was a crystalline layer having a continuous structure in the thickness direction, and the crystalline layer was formed of an oxide having a bixbyite-type crystal structure. The results are shown in Table 1.

Example 9

A non-alkali glass substrate having a diameter of 4 inches was provided. Mo was deposited on the substrate by sputtering to a thickness of 50 nm, and patterned by photolithography in the shape of a gate. The substrate was placed in a plasma CVD system, and held at 350° C. while introducing SiH$_4$ (2 sccm), N$_2$O (100 sccm), and N$_2$ (120 sccm) under a pressure of 110 Pa to form a gate insulating film having a thickness of 150 nm.

The resulting glass substrate provided with the gate insulating film was placed in a sputtering system, and InGaO (Ga/(In+Ga)=0.072 (atomic ratio)) was deposited in the same manner as in Example 1 to form an oxide semiconductor layer having a thickness of 50 nm. The oxide semiconductor layer was subjected to photolithography to form a channel section (channel length L: 20 μm, channel width W: 50 μm).

The substrate was again placed in the plasma CVD system, and held at 170° C. while introducing SiH$_4$ (2 sccm), N$_2$O (100 sccm), and N$_2$ (120 sccm) under a pressure of 110 Pa to form an interlayer insulating film having a thickness of 50 nm.

The substrate was then placed in a dry etching system, and contact holes for the gate electrode and the source/drain electrodes were formed. The resulting laminate was placed in a sputtering system. After depositing Mo, the resulting film was patterned by photolithography to form source/drain electrodes.

The substrate was annealed at 300° C. for 8 hours in air.

The substrate was again placed in the plasma CVD system, and held at 250° C. while introducing $SiH_4$ (2 sccm), $N_2O$ (100 sccm), and $N_2$ (120 sccm) under a pressure of 110 Pa to form an interlayer insulating film having a thickness of 300 nm. Contact holes for the source/drain/gate electrodes were formed by photolithography. The substrate was then annealed at 350° C. for 1 hour in air to obtain a TFT.

The resulting TFT was evaluated in the same manner as in Example 1. It was confirmed that the composition of the oxide semiconductor layer was homogenous in the thickness direction, the oxide semiconductor layer was a crystalline layer having a continuous structure in the thickness direction, and the crystalline layer was formed of an oxide having a bixbyite-type crystal structure. The results are shown in Table 1.

Example 10

A non-alkali glass substrate having a diameter of 4 inches was provided. Mo was deposited on the substrate by sputtering to a thickness of 50 nm, and patterned by photolithography in the shape of a gate. The substrate was placed in a plasma CVD system, and held at 350° C. while introducing $SiH_4$ (2 sccm), $N_2O$ (100 sccm), and $N_2$ (120 sccm) under a pressure of 110 Pa to form a gate insulating film having a thickness of 150 nm.

The resulting glass substrate provided with the gate insulating film was placed in a sputtering system, and InGaO (Ga/(In+Ga)=0.072 (atomic ratio)) was deposited in the same manner as in Example 1 to form an oxide semiconductor layer having a thickness of 50 nm. The oxide semiconductor layer was subjected to photolithography to form a channel section (channel length L: 20 μm, channel width W: 50 μm).

The substrate was then annealed at 300° C. for 1 hour in air. The substrate was again placed in the plasma CVD system, and held at 200° C. while introducing $SiH_4$ (4 sccm), $N_2O$ (100 sccm), and $N_2$ (120 sccm) under a pressure of 110 Pa to form an interlayer insulating film having a thickness of 50 nm. The substrate was then placed in a dry etching system, and contact holes for the gate electrode and the source/drain electrodes were formed. The resulting laminate was placed in a sputtering system. After depositing Mo, the resulting film was patterned by photolithography to form source/drain electrodes.

The substrate was annealed at 300° C. for 8 hours in air.

The substrate was again placed in the plasma CVD system, and held at 250° C. while introducing $SiH_4$ (2 sccm), $N_2O$ (100 sccm), and $N_2$ (120 sccm) under a pressure of 110 Pa to form an interlayer insulating film having a thickness of 300 nm. Contact holes for the source/drain/gate electrodes were formed by photolithography. The substrate was then annealed at 350° C. for 1 hour in air to obtain a TFT.

The resulting TFT was evaluated in the same manner as in Example 1. It was confirmed that the composition of the oxide semiconductor layer was homogenous in the thickness direction, the oxide semiconductor layer was a crystalline layer having a continuous structure in the thickness direction, and the crystalline layer was formed of an oxide having a bixbyite-type crystal structure. The results are shown in Table 1.

Example 11

A non-alkali glass substrate having a diameter of 4 inches was provided. Mo was deposited on the substrate by sputtering to a thickness of 50 nm, and patterned by photolithography in the shape of a gate. The substrate was placed in a plasma CVD system, and held at 350° C. while introducing $SiH_4$ (2 sccm), $N_2O$ (100 sccm), and $N_2$ (120 sccm) under a pressure of 110 Pa to form a gate insulating film having a thickness of 150 nm.

The resulting glass substrate provided with the gate insulating film was placed in a sputtering system, and InGaO (Ga/(In+Ga)=0.072 (atomic ratio)) was deposited in the same manner as in Example 1, except that the total pressure was set to 0.4 Pa, and the gas flow rate ratio was set to $Ar:O_2$=50:50, to form an oxide semiconductor layer having a thickness of 30 nm. The oxide semiconductor layer was subjected to photolithography to form a channel section (channel length L: 20 μm, channel width W: 50 μm).

The substrate was then annealed at 300° C. for 1 hour under vacuum.

The substrate was again placed in the plasma CVD system, and held at 170° C. while introducing $SiH_4$ (2 sccm), $N_2O$ (100 sccm), and $N_2$ (120 sccm) under a pressure of 110 Pa to form an interlayer insulating film having a thickness of 50 nm. The substrate was then placed in a dry etching system, and contact holes for the gate electrode and the source/drain electrodes were formed. The resulting laminate was placed in a sputtering system. After depositing Mo, the resulting film was patterned by photolithography to form source/drain electrodes.

The substrate was annealed at 300° C. for 4 hours in air.

The substrate was again placed in the plasma CVD system, and held at 250° C. while introducing $SiH_4$ (2 sccm), $N_2O$ (100 sccm), and $N_2$ (120 sccm) under a pressure of 110 Pa to form an interlayer insulating film having a thickness of 300 nm. Contact holes for the source/drain/gate electrodes were formed by photolithography. The substrate was then annealed at 350° C. for 1 hour in air to obtain a TFT.

The resulting TFT was evaluated in the same manner as in Example 1. It was confirmed that the composition of the oxide semiconductor layer was homogenous in the thickness direction, the oxide semiconductor layer was a crystalline layer having a continuous structure in the thickness direction, and the crystalline layer was formed of an oxide having a bixbyite-type crystal structure. The results are shown in Table 1.

Comparative Example 1

A TFT was produced, and evaluated in the same manner as in Example 1, except that annealing (300° C., 1 hour) was performed in a hydrogen atmosphere immediately before forming the protective layer 70 to increase the carrier concentration in the oxide semiconductor layer 40.

It was confirmed that the composition of the oxide semiconductor layer was homogenous in the thickness direction, the oxide semiconductor layer was a crystalline layer having a continuous structure in the thickness direction, and the crystalline layer was formed of an oxide having a bixbyite-type crystal structure. The results are shown in Table 1.

Comparative Example 2

A TFT was produced, and evaluated in the same manner as in Example 1, except that annealing (300° C., 1 hour) was performed in air immediately before forming the protective layer 70 to decrease the carrier concentration in the oxide semiconductor layer 40.

It was confirmed that the composition of the oxide semiconductor layer was homogenous in the thickness direction, the oxide semiconductor layer was a crystalline layer having a continuous structure in the thickness direction, and the crystalline layer was formed of an oxide having a bixbyite-type crystal structure. The results are shown in Table 1.

Comparative Example 3

A TFT was produced, and evaluated in the same manner as in Example 8, except that the gate insulating film was formed by CVD, and the carrier concentration in the oxide semiconductor layer increased since the substrate temperature during CVD was relatively high (450° C.).

It was confirmed that the composition of the oxide semiconductor layer was homogenous in the thickness direction, the oxide semiconductor layer was a crystalline layer having a continuous structure in the thickness direction, and the crystalline layer was formed of an oxide having a bixbyite-type crystal structure. The results are shown in Table 1.

Comparative Example 4

A TFT was produced, and evaluated in the same manner as in Example 9, except that the thickness of the interlayer insulating film coming in contact with the channel layer was changed to 5 nm.

It was confirmed that the composition of the oxide semiconductor layer was homogenous in the thickness direction, the oxide semiconductor layer was a crystalline layer having a continuous structure in the thickness direction, and the crystalline layer was formed of an oxide having a bixbyite-type crystal structure. The results are shown in Table 1.

Comparative Example 5

A TFT was produced, and evaluated in the same manner as in Example 10, except that the substrate temperature was set to 300° C. when forming the interlayer insulating film coming in contact with the channel layer.

It was confirmed that the composition of the oxide semiconductor layer was homogenous in the thickness direction, the oxide semiconductor layer was a crystalline layer having a continuous structure in the thickness direction, and the crystalline layer was formed of an oxide having a bixbyite-type crystal structure. The results are shown in Table 1.

Comparative Example 6

A TFT was produced, and evaluated in the same manner as in Example 11, except that vacuum annealing was not performed before forming the interlayer insulating film coming in contact with the channel layer.

It was confirmed that the composition of the oxide semiconductor layer was homogenous in the thickness direction, the oxide semiconductor layer was a crystalline layer having a continuous structure in the thickness direction, and the crystalline layer was formed of an oxide having a bixbyite-type crystal structure. The results are shown in Table 1.

Evaluation of Bandgap of Oxide Semiconductor Thin Film

The bandgap of the oxide semiconductor thin film formed on a quartz substrate was evaluated by spectroscopic ellipsometry. The absorption coefficient was calculated from the refractive index and the extinction coefficient, and the direct bandgap was calculated from a graph of the second power of the absorption coefficient and the energy. It was confirmed by ICP-AES analysis that the atomic ratio of each element included in the semiconductor thin film was the same as that of the sputtering target. The bandgap of the films of Examples 1 to 3, Examples 7 to 11, and Comparative Examples 1 to 6 was 3.7 to 4.0 eV. The bandgap of the films of Examples 4 to 6 was 3.5 eV or more.

TABLE 1

| | Channel layer | Carrier concentration in channel layer (/cm$^3$) | Carrier concentration in channel layer up to depth of 5 nm (/cm$^3$) | Mobility (cm$^2$/V·s) | S-factor (V/decade) | $V_{th}$ (V) | $\Delta V_{th}$ (V) | on-off ratio |
|---|---|---|---|---|---|---|---|---|
| Example 1 | InGaO | $2.6 \times 10^{18}$ | $3 \times 10^{19}$ | 125 | 0.30 | 0.1 | 0.2 | $10^9$ |
| Example 2 | InGaAlO | $1.2 \times 10^{18}$ | $5 \times 10^{18}$ | 95 | 0.35 | 0.3 | 0.2 | $10^8$ |
| Example 3 | InAlO | $4.0 \times 10^{18}$ | $5 \times 10^{19}$ | 110 | 0.33 | −0.2 | 0.3 | $10^8$ |
| Example 4 | In$_2$O$_3$ | $2.5 \times 10^{19}$ | $3 \times 10^{20}$ | 101 | 0.41 | −3.0 | 0.5 | $10^7$ |
| Example 5 | InZnO | $1.4 \times 10^{17}$ | $2 \times 10^{18}$ | 59 | 0.30 | 1.4 | 0.3 | $10^7$ |
| Example 6 | InSnO | $5.0 \times 10^{19}$ | $1 \times 10^{21}$ | 82 | 0.51 | −4.3 | 0.6 | $10^7$ |
| Example 7 | InGaO | $3.1 \times 10^{18}$ | $4 \times 10^{19}$ | 106 | 0.15 | −0.1 | 0.1 | $10^{10}$ |
| Example 8 | InGaO | $7.5 \times 10^{18}$ | $5 \times 10^{19}$ | 137 | 0.40 | −0.5 | 0.4 | $10^7$ |
| Example 9 | InGaO | $2.1 \times 10^{18}$ | $1 \times 10^{19}$ | 140 | 0.12 | 0.0 | 0.1 | $10^{10}$ |
| Example 10 | InGaO | $5.4 \times 10^{18}$ | $9 \times 10^{19}$ | 105 | 0.21 | −0.4 | 0.3 | $10^8$ |
| Example 11 | InGaO | $1.4 \times 10^{18}$ | $7 \times 10^{18}$ | 90 | 0.18 | 0.2 | 0.2 | $10^9$ |
| Comparative Example 1 | InGaO | $1.0 \times 10^{20}$ | $6 \times 10^{21}$ | 80 | 2.00 | −30.5 | 5.0 | $10^3$ |
| Comparative Example 2 | InGaO | $9.2 \times 10^{15}$ | $5 \times 10^{17}$ | 38 | 0.42 | 0.1 | 0.3 | $10^7$ |
| Comparative Example 3 | InGaO | $2.3 \times 10^{20}$ | $5 \times 10^{20}$ | 50 | 1.30 | −15.4 | 4.0 | $10^4$ |
| Comparative Example 4 | InGaO | $9.0 \times 10^{15}$ | $5 \times 10^{16}$ | 40 | 0.20 | 0.0 | 0.1 | $10^{10}$ |
| Comparative Example 5 | InGaO | $8.0 \times 10^{19}$ | $3 \times 10^{19}$ | 112 | 3.00 | −11.0 | 3.0 | $10^5$ |
| Comparative Example 6 | InGaO | $7.0 \times 10^{17}$ | $7 \times 10^{17}$ | 30 | 1.00 | −5.2 | 1.0 | $10^8$ |

The thin film transistors of the invention exhibited high mobility and a large on-off ratio as shown in Examples 1 to 11. The thin film transistors of the comparative examples did not exhibit high mobility and a large on-off ratio in combination (i.e., exhibited inferior performance).

INDUSTRIAL APPLICABILITY

The thin film transistor according to the invention may be used for a semiconductor device, an electrical device, and a circuit of a display and the like.

Although only some exemplary embodiments and/or examples of the invention have been described in detail above, those skilled in the art will readily appreciate that many modifications are possible in the exemplary embodiments and/or examples without materially departing from the novel teachings and advantages of the invention. Accordingly, all such modifications are intended to be included within the scope of the invention.

The documents described in the specification, and the specification of the Japanese patent application to which the present application claims priority under the Paris Convention, are incorporated herein by reference in their entirety.

The invention claimed is:

1. A thin film transistor comprising a source electrode, a drain electrode, a gate electrode, a gate insulating film, and a channel layer that is formed of an oxide semiconductor comprising a bixbyite-type crystal structure,
   the channel layer having an average carrier concentration of $1\times10^{16}/cm^3$ to $5\times10^{19}/cm^3$, and comprising a high carrier concentration region that is situated on a side of the gate insulating film and has a carrier concentration higher than the average carrier concentration, and
   the channel layer having a substantially homogeneous composition,
   wherein a field-effect mobility of the thin film transistor is 40 $cm^2/Vs$ or more.

2. The thin film transistor according to claim 1, wherein the channel layer has a thickness of 10 nm or more, and the high carrier concentration region has an average carrier concentration of $1\times10^{18}/cm^3$ to $5\times10^{21}/cm^3$.

3. The thin film transistor according to claim 1, wherein the high carrier concentration region is a region of the channel layer up to a depth of 5 nm from an interface with the gate insulating film.

4. The thin film transistor according to claim 1, wherein the oxide semiconductor is indium oxide, Ga-doped indium oxide, Al-doped indium oxide, Ga—Al-doped indium oxide, Zn-doped indium oxide, or Sn-doped indium oxide.

5. The thin film transistor according to claim 4, wherein the Ga-doped indium oxide has an atomic ratio "Ga/(Ga+In)" of 0.007 to 0.207.

6. The thin film transistor according to claim 4, wherein the Al-doped indium oxide has an atomic ratio "Al/(Al+In)" of 0.003 to 0.125.

7. The thin film transistor according to claim 1, the thin film transistor having a bottom-gate structure.

8. The thin film transistor according to claim 7, further comprising a protective layer that is formed on the channel layer.

9. The thin film transistor according to claim 8, wherein the protective layer is an insulating film having oxygen permeability.

10. The thin film transistor according to claim 1, the thin film transistor having a top-gate structure.

* * * * *